US007557671B2

(12) United States Patent
Liang

(10) Patent No.: US 7,557,671 B2
(45) Date of Patent: Jul. 7, 2009

(54) REAL TIME VCO GAIN NON LINEARITY CALIBRATION

(75) Inventor: Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 145 days.

(21) Appl. No.: 11/704,881

(22) Filed: Feb. 8, 2007

(65) Prior Publication Data

US 2008/0191811 A1    Aug. 14, 2008

(51) Int. Cl.
    *H03C 3/08*    (2006.01)
(52) U.S. Cl. .............................. 332/124; 331/44; 331/17
(58) Field of Classification Search ................... 331/44, 331/17; 327/159; 332/124
    See application file for complete search history.

(56) References Cited

U.S. PATENT DOCUMENTS

| 4,282,497 | A | | 8/1981 | Hulbert |
| 5,225,783 | A | * | 7/1993 | Suzuki et al. ............... 324/655 |
| 5,952,895 | A | | 9/1999 | McCune, Jr. et al. |
| 6,806,780 | B2 | * | 10/2004 | Fontaine et al. .............. 331/17 |
| 6,870,629 | B1 | * | 3/2005 | Vogel et al. ................... 356/519 |
| 6,873,668 | B2 | * | 3/2005 | Yamamoto et al. ........... 375/373 |
| 7,015,738 | B1 | * | 3/2006 | Cao ............................. 327/159 |
| 2005/0285688 | A1 | | 12/2005 | Hirano et al. |

\* cited by examiner

*Primary Examiner*—James Cho
*Assistant Examiner*—Crystal L Hammond

(57) ABSTRACT

A method of determining a gain nonlinearity receives a phase difference and generates an output frequency based on the received phase difference. The method reconstructs a waveform by using the output frequency. The method preprocesses the phase difference to generate a comparison waveform. The method compares the reconstructed waveform to the comparison waveform and determines a gain nonlinearity based on the comparison between the reconstructed and comparison waveforms. A modulation system includes a voltage controlled oscillator for receiving an input signal based on a phase difference and generating an output frequency. The system further includes a waveform reconstructor and a comparator. The waveform reconstructor is coupled to the voltage controlled oscillator, and is for reconstructing a waveform based on the output frequency. The comparator is coupled to the waveform reconstructor, and is for comparing the output of the waveform reconstructor with the input signal. The comparator is configured for determining a gain nonlinearity exhibited by the voltage controlled oscillator. Particular embodiments further include a compensator.

22 Claims, 6 Drawing Sheets

REAL TIME VCO GAIN NON LINEARITY CALIBRATION

FIELD OF THE INVENTION

The present invention is related to the field of voltage controlled oscillators (VCO), and is more specifically directed to real time VCO gain non linearity calibration.

BACKGROUND

Cellular communication usage is on the rise. With the increase in usage, the underlying technologies have proliferated and expanded. For instance, cellular devices typically have a variety of modes that are selected or operated for particular applications or in different markets. To support the various cellular communication modes, conventional transceivers include voltage controlled oscillators that are tunable over a range of frequencies. Generally, it is desirable for these voltage controlled oscillators to maintain linear gain. However, due to a number of factors, the gain is often nonlinear. The nonlinear gain is exhibited in the K factor for the voltage controlled oscillator or $K_{VCO}$. Typically, as the transmitted signal modulates away from the tuned frequency the $K_{VCO}$ drops, and the generated frequency drops below the desired frequency, thus degrading the signal transmission.

SUMMARY OF THE INVENTION

A method of determining a gain nonlinearity receives a phase difference and generates an output frequency based on the received phase difference. The method reconstructs a waveform by using the output frequency. The method preprocesses the input phase difference to generate a comparison waveform. The method compares the reconstructed waveform to the comparison waveform and determines a gain nonlinearity based on the comparison between the reconstructed and comparison waveforms.

Comparing in some embodiments involves a segment-by-segment multi-segment comparison. Preferably, the result of the comparing operation is stored in a calibration table. Further, the comparing operation preferably includes updating the calibration table. Hence, these embodiments typically include a multi-segment calibration table. Determining the gain nonlinearity preferably occurs in real time during the processing of a signal. The gain nonlinearity is related to the design and process. The gain nonlinearity variation is related to a temperature change, part-to-part differences, and aging of the device. Some embodiments, by using the determined and/or stored gain nonlinearity data, additionally compensate for the determined gain nonlinearity. In some of these embodiments, compensating further includes generating a compensation vector, and generating the output frequency based on the compensation vector. Preferably, the compensation vector is generated by using a segment-by-segment comparison.

A method of compensating a gain nonlinearity receives a phase difference signal and generates an output frequency based on the received phase difference signal. The method estimates the gain nonlinearity from the output frequency and the phase difference signal and compensates for the estimated gain nonlinearity.

In particular embodiments, estimating the gain nonlinearity further includes one or more steps for reconstructing a waveform by using the output frequency, preprocessing the phase difference signal to generate a comparison waveform, comparing the reconstructed waveform to the comparison waveform, and/or determining a gain nonlinearity based on the comparison between the reconstructed and comparison waveforms.

For the compensating operation, some embodiments generate a compensation vector, and generate the output frequency based on the compensation vector. Preferably, the compensation vector is generated by using a segment-by-segment comparison. In these embodiments, the method typically stores the estimated gain nonlinearity in a compensation table, and preferably updates the compensation table in real time.

A modulation system includes a voltage controlled oscillator for receiving an input signal based on a phase difference, and for generating an output frequency. The system further includes a waveform reconstructor and a comparator. The waveform reconstructor is coupled to the voltage controlled oscillator, and is for reconstructing a waveform based on the output frequency. The comparator is coupled to the waveform reconstructor, and is for comparing the output of the waveform reconstructor with the input signal. The comparator is configured for determining a gain nonlinearity exhibited by the voltage controlled oscillator. Particular embodiments further include a preprocessor, a compensator, and/or a calibration table.

The preprocessor is coupled to the comparator. The preprocessor is for receiving the input signal and preprocessing the input signal to match a characteristic of the output of the waveform reconstructor. The characteristic typically includes a filtering characteristic, for example. The comparator is preferably a multi-segment comparator configured to perform a segment-by-segment comparison. The calibration table is typically configured to store information relating to a waveform comparison. The compensator is for generating a compensation vector for calibrating the voltage controlled oscillator such that the gain nonlinearity is reduced.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

Modern digital transceivers typically include both digital components such as a direct digital synthesizer (DDS) and a frequency-to-digital converter (FDC), and traditional analog components such as a voltage controlled oscillator, for example. In these systems, the output of the voltage controlled oscillator preferably tracks the input of the direct digital synthesizer. Hence, with an appropriate frequency-to-digital converter design, the waveform at the output of the voltage controlled oscillator is advantageously reconstructed and represented digitally. By comparing two digital waveforms, the reconstructed waveform and a comparison waveform, generated from the input signal, the voltage controlled oscillator gain-nonlinearity is advantageously determined. Once determined, the gain nonlinearity is further advantageously compensated. Accordingly, some embodiments of the invention provide a two part approach of determining a gain nonlinearity, and then optionally compensating for the determined gain nonlinearity.

Preferably, the two part approach uses the comparison waveform in conjunction with a correction table for providing a compensation vector. These embodiments advantageously update the correction table in real-time without the need for disrupting the transmission.

Figure 1:
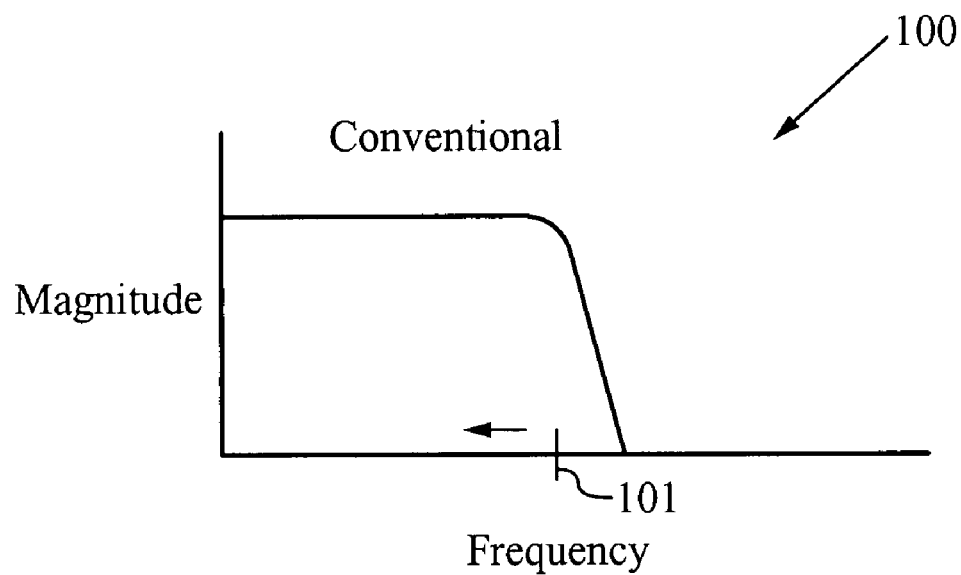
FIG. 1 conceptually illustrates a transfer function for a conventional phase-lock loop (PLL) or frequency synthesizer having a voltage controlled oscillator.

FIG. 1 conceptually illustrates the reference input to VCO output frequency modulation transfer function of a conventional frequency synthesizer 100 that includes a voltage controlled oscillator. As shown in this figure, the conventional implementation acts as a low pass filter that passes signals up to a certain frequency 101. Accordingly, the conventional implementations and methods have limited bandwidth capability.

Figure 2:
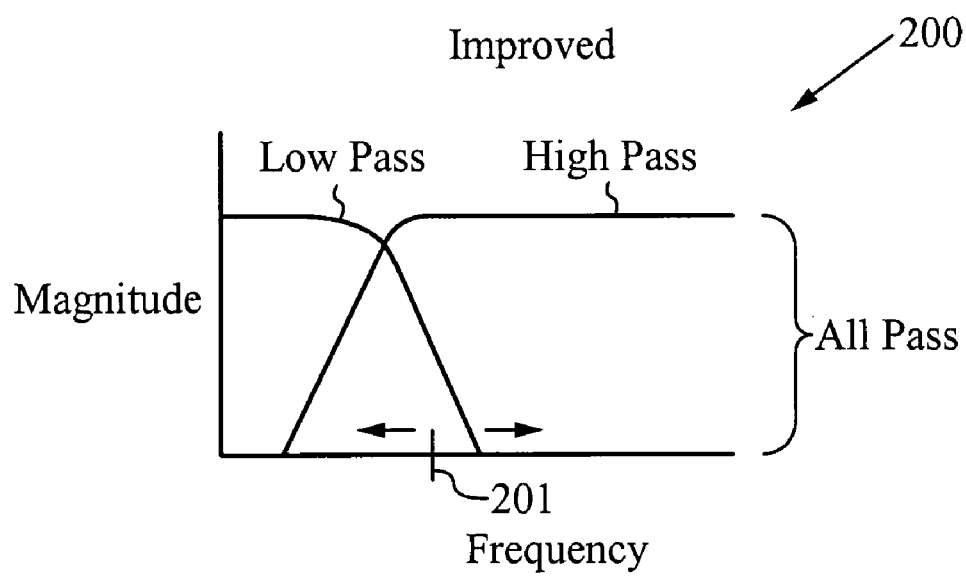
FIG. 2 conceptually illustrates the performance of an improved digital modulation or synthesizer system having a voltage controlled oscillator.
Figure 2A:
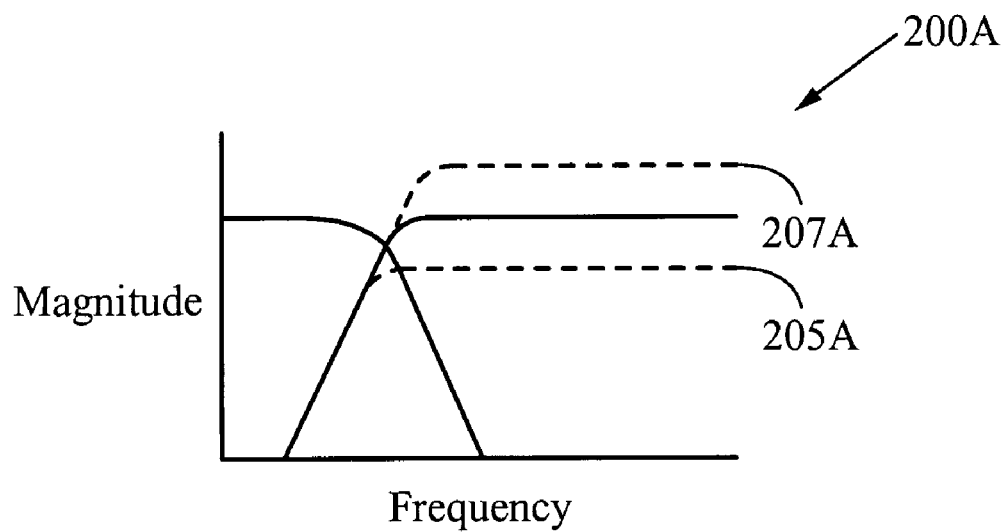
FIG. 2A conceptually illustrates effects of unmatched gain and compensation.
Figure 2B:
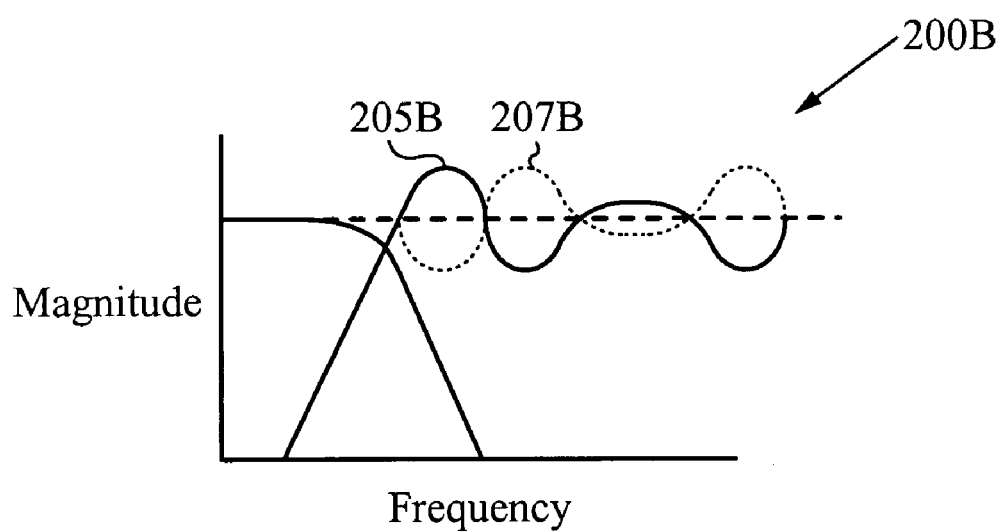
FIG. 2B further illustrates effects of unmatched gain and compensation.

FIG. 2 conceptually illustrates the performance of an improved modulation system 200 that has a number of digital (polar) components and a voltage controlled oscillator. As shown in this figure, some embodiments include the low pass frequencies as well as the high pass frequencies, thus implementing, in effect, an all pass system. However, due to the implementation details of such an all pass system, these embodiments are prone to undesirable effects such as gain nonlinearity. For instance, the voltage controlled oscillator of some embodiments exhibits gain nonlinearity variation when exposed to temperature fluctuations and/or device aging. FIGS. 2A and 2B illustrate additional undesirable gain effects that are further discussed below.

Figure 3:
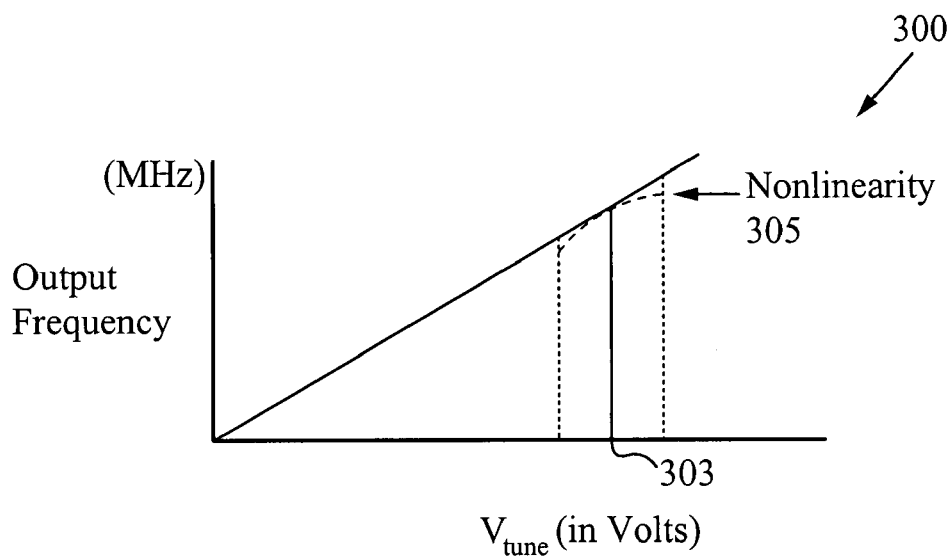
FIG. 3 conceptually illustrates gain nonlinearity in relation to frequency.

FIG. 3 conceptually illustrates gain non linearity in relation to frequency. As shown in this figure, a particular tuning voltage 303 when applied to the voltage controlled oscillator is expected to produce an output frequency in a substantially linear relationship 300. Similarly, a change in tuning voltage is expected to produce a proportionate change in output frequency. However, certain conditions cause a deviation in the expected linear relationship, thereby undesirably producing gain nonlinearity 305.

Figure 4:
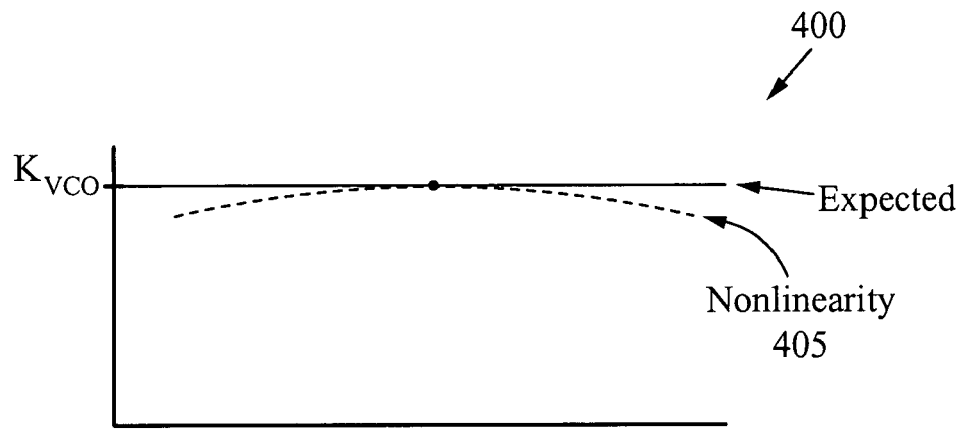
FIG. 4 conceptually illustrates gain nonlinearity in relation to $K_{VCO}$.

FIG. 4 conceptually illustrates gain non linearity 405 in relation to $K_{VCO}$. $K_{VCO}$ is the nominal modulation sensitivity for the voltage controlled oscillator. As shown in this figure, the $K_{VCO}$ is expected to be relatively constant across a range of conditions, such as time, temperature, and tuning voltages, for example. However, in response to certain conditions, the $K_{VCO}$ is not always constant, and thereby results in nonlinear gain effects 405.

Figure 5:
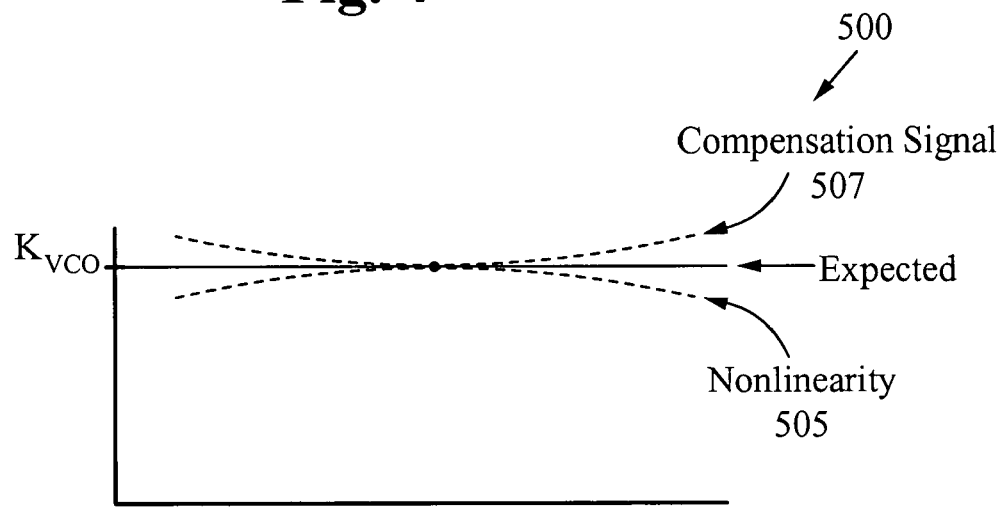
FIG. 5 conceptually illustrates gain nonlinearity with compensation.

As mentioned above, to counteract the effects of gain nonlinearity variation, some embodiments advantageously determine the gain nonlinearity in real time during operation of the system. Once the nonlinearity is determined, these embodiments further optionally compensate for the nonlinearity, preferably, by providing a calibration or compensation vector. FIG. 5 conceptually illustrates a gain non linearity 505 with an appropriate matching compensation vector 507. To perform the determination of gain nonlinearity and/or the compensation, some embodiments include particular hardware implementations.

Figure 6:
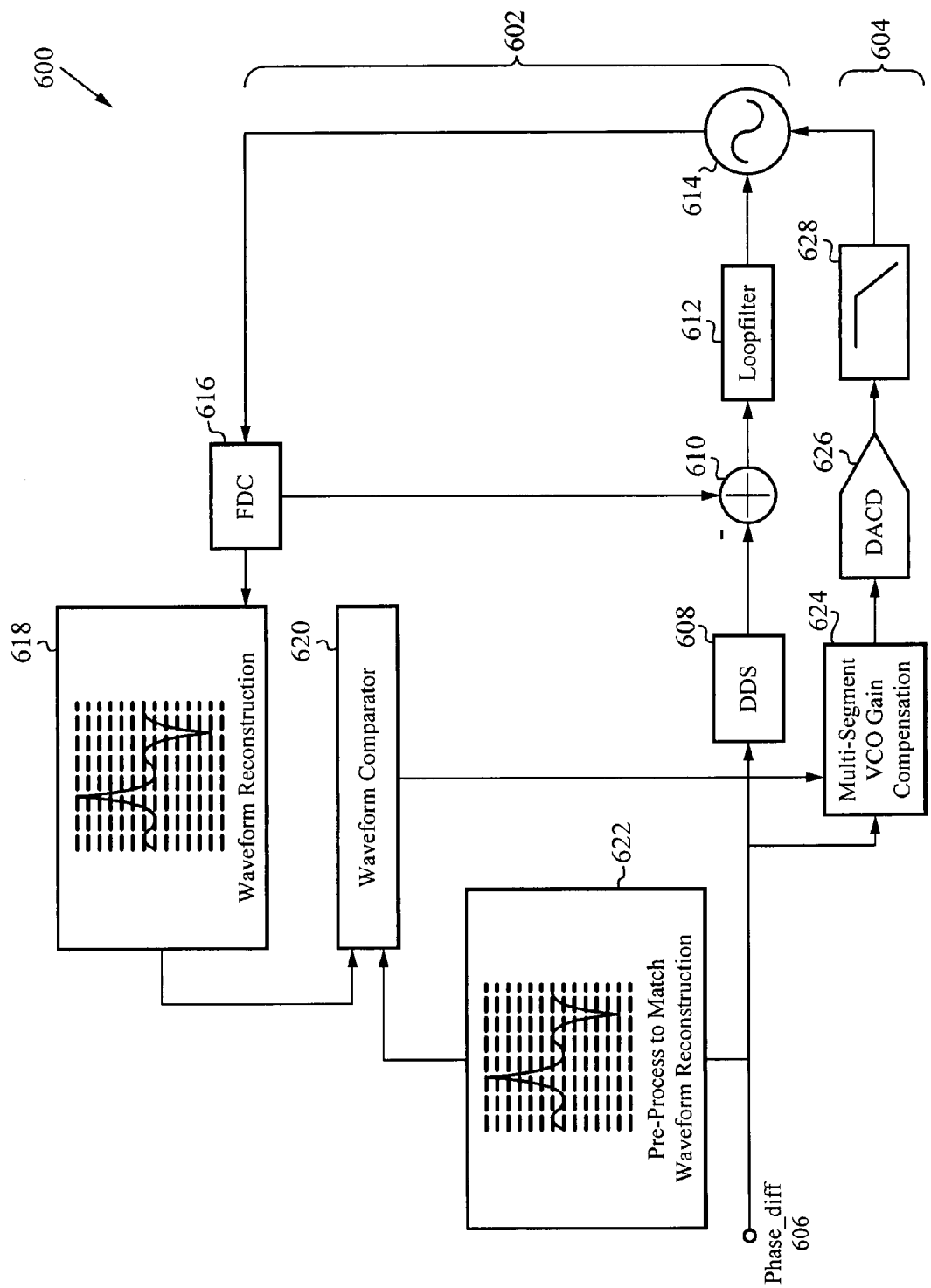
FIG. 6 illustrates a polar architecture for the modulation system of some embodiments.

FIG. 6 illustrates a polar architecture 600 for a modulation system of some embodiments. As shown in this figure, the architecture 600 includes a modified phase locked loop 602, a compensation path 604, and an input signal 606. The architecture 600 is preferably configured to determine gain nonlinearity and/or to compensate for the determined gain nonlinearity. As mentioned above, these embodiments typically perform the determination and/or compensation in real time, and on the fly during operation, including during transmission, for example. More specifically, particular embodiments perform calibration by using the transmitted message signal itself, and without the need for sending a separate calibration signal. For instance, some embodiments perform calibration during tuning and do not otherwise affect the signal transmission.

The input signal 606 is typically a digital type frequency modulation signal. Alternatively, the signal 606 is another type of signal in different embodiments, such as a frequency signal in the digital domain, for example. The modified phase locked loop 602 includes a direct digital synthesizer (DDS) 608, that receives the signal 606, converts the phase difference or other type of signal to a preferred digital type signal, as needed, and passes the digital signal to a combiner 610. The combiner 610 combines the digital signal with the output of a frequency-to-digital converter 616. The combiner 610 then outputs to a loop filter 612, which outputs to a voltage controlled oscillator 614. The voltage controlled oscillator 614 combines the output of the loop filter 612 with the output of the compensation path 604, and thereby generates a frequency that is provided as an input into the frequency-to-digital converter 616, mentioned above.

Also mentioned above, the frequency-to-digital converter 616 outputs to the combiner 610, and further outputs to a waveform reconstructor 618. The waveform reconstructor 618 generates the reconstructed signal waveform preferably by using segmented waveform reconstruction, and outputs the reconstructed waveform to a multi-segment waveform comparator 620.

The waveform comparator 620 also receives a comparison waveform from a preprocessor 622. The preprocessor 622 takes as input, the phase difference signal 606, and preprocesses the phase difference to match particular elements of the waveform reconstruction and/or artifacts caused by the phase locked loop 602. These elements include, for example, the timing delay and the filtering performed by the phase locked loop 602 on the reconstructed signal.

The waveform comparator 620 then compares the reconstructed waveform from the phase locked loop 602, with the comparison phase difference signal 606 from the preprocessor 622, and outputs the signal differences to a compensator 624 in the compensation path 604. The compensator 624 uses the output of the waveform comparator 620 to generate a compensation or calibration signal for the voltage controlled oscillator 614 of the architecture 600. The compensator 624 of some embodiments applies multi-segment voltage controlled oscillator gain compensation. The compensator 624 outputs to a digital-to-analog converter driver (DACD) 626, which outputs an analog signal to a low pass filter 628. The low pass filter 628 outputs to the voltage controlled oscillator 614, which generates a frequency based on the analog signal from the compensation path 604, and based on the output of the loop filter 612 of the phase locked loop 602, as described above.

Figure 7:
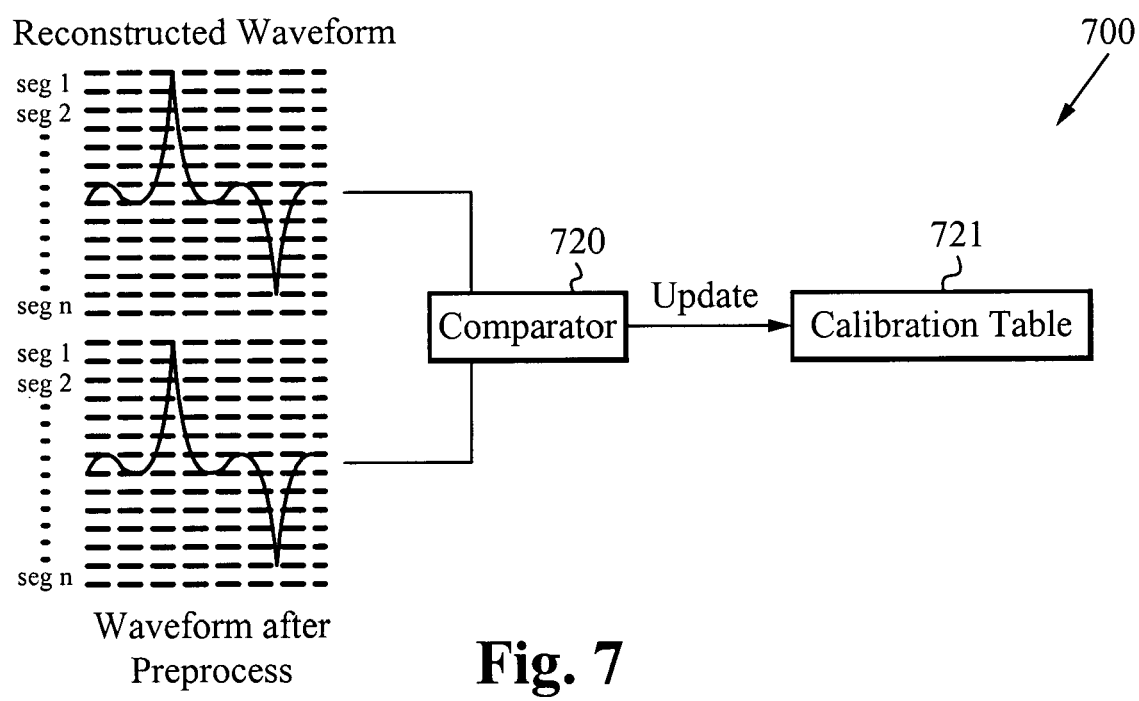
FIG. 7 illustrates a multi-segment waveform comparator according to some embodiments.

FIG. 7 illustrates the waveform comparison operation and comparator 720 of some embodiments in further detail. As shown in this figure, the comparison is advantageously performed segment-by-segment for multiple segments such as "segment 1" to "segment n," for instance. A segment is the portion of a signal within a discrete time interval, such that a set of segments forms part or all of the signal. This multi-segment approach preferably reconstructs the voltage controlled oscillator gain-nonlinearity that particularly requires compensation. As further shown in FIG. 7, some embodiments employ a calibration table 721 that has a multi-segment format. In these embodiments, the calibration table 721 is updated segment-by-segment. In this manner, some embodiments update the calibration table 721 at the frame rate of transmission, or at another rate, as needed by the rate and/or degree of a particular constraint such as, for example, the rate or degree of temperature variation of the voltage controlled oscillator.

For instance, when a modulation system utilizing a voltage controlled oscillator, such as in a cellular phone, is taken from one ambient temperature to another much different temperature, the voltage controlled oscillator typically requires a large amount of signal correction, on the fly. Otherwise, the call will become garbled or dropped. Such temperature variations are common when transitioning between indoor and outdoor environments.

One of ordinary skill recognizes further variations in the digital modulation system architecture 600 illustrated in FIG. 6. For instance, some embodiments include a frequency-to-digital converter (FDC) design that receives the output of the voltage controlled oscillator and outputs to the waveform reconstructor. These embodiments further selectively include particular variations to the design of the decimation filter.

Preferably an initial calibration table, or initial state for the calibration table, is stored in a memory coupled to the modulation system. Typically, a separate calibration table is configured for each desired band of operation, such that there is one table per band. The initial calibration table is typically updated when the voltage controlled oscillator receives a tune command. Accordingly, the calibration table of these embodiments is dynamically updated in real time. Due to the additional digital components, some embodiments employ an increase in digital current for the system over traditional architectures that do not perform the additional steps for comparing and compensating, and that do not include a compensation table in a memory.

Some embodiments measure the phase difference signal, using the frequency-to-digital converter 616, from the output of the power amplifier (PA), so that the temperature variation and aging of the amplitude or phase modulation (AM/PM) characteristic is compensated for based on the proper temperature and/or timing.

Figure 8:
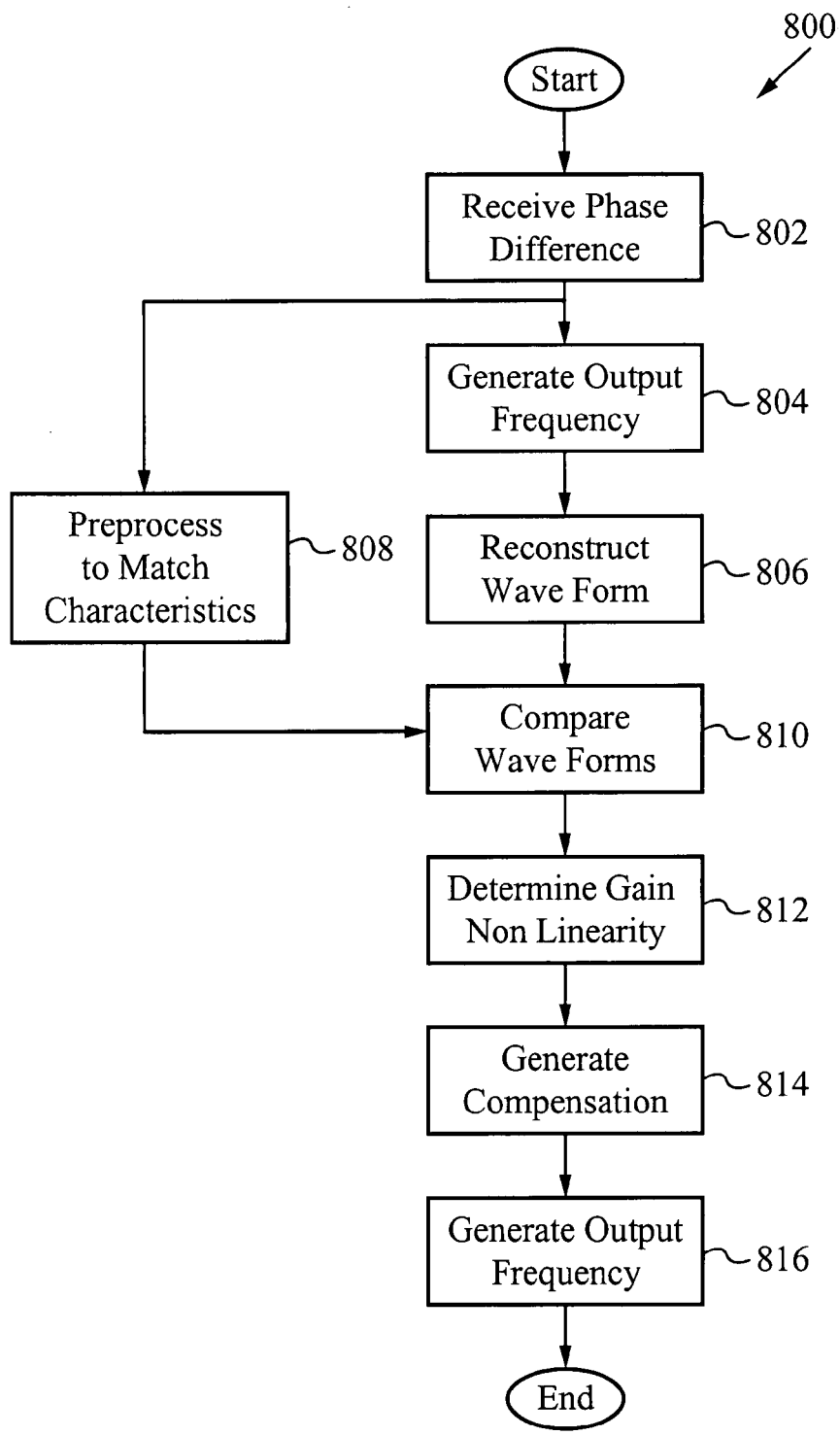
FIG. 8 illustrates a method of determining and/or compensating for a gain nonlinearity in accordance with some embodiments of the invention.

FIG. 8 illustrates a process 800 that determines and/or compensates for a gain nonlinearity in accordance with some embodiments of the invention. As shown in this figure, the process 800 begins at the step 802, where an input signal is received. The input signal typically comprises a phase difference, as mentioned above. Then, the process 800 transitions to the step 804, where an output frequency is generated based on the received phase difference. Once the output frequency is generated at the step 804, the process 800 transitions to the step 806, where a waveform is reconstructed by using the output frequency. Then, the process 800 transitions to the step 808, where the phase difference is preprocessed to generate a comparison waveform.

Generally, the preprocessing matches the comparison waveform to one or more characteristics of the reconstructed waveform such as filtering and/or timing, for example. As shown in FIG. 8, the particular order of the preprocessing step 808 is not fixed, and some embodiments alternatively perform the preprocessing of step 808 in parallel with the steps 804 and/or 806.

Regardless of any parallel processing, once the waveforms are reconstructed and/or preprocessed at the steps 806 and 808, then the process 800 transitions to the step 810, where the reconstructed waveform is compared to the comparison waveform, which has been preprocessed to adjust or control for the additional artifacts present in the reconstructed waveform. Then, at the step 812, the process 800 advantageously determines a gain nonlinearity based on the difference between the reconstructed and comparison waveforms.

After the step 812, the process 800 of some embodiments concludes. However, alternatively or in conjunction with the steps 802 through 812 of the process 800, some embodiments further perform additional steps for the compensation of the determined gain nonlinearity. In these embodiments, the process 800 instead of concluding after the step 812, transitions to the step 814, where a compensation vector is generated. Next, at the step 816, the output frequency is generated based on the generated compensation vector. Then, the process 800 concludes.

Advantages

As mentioned above, some embodiments generate the compensation vector by using a segment-by-segment comparison, during the comparison step. Some of these embodiments store a result of the comparing step in a calibration table. The step of comparing for these implementations further typically comprises updating the calibration table. Preferably, the calibration table includes a multi-segment calibration table. Also mentioned above, the gain nonlinearity is often related to a change in the ambient temperature surrounding the voltage controlled oscillator. Hence, the step of determining the gain nonlinearity preferably occurs in real time during the processing of a signal, while relevant information is advantageously stored for retrieval at an appropriate time on an as needed basis.

Moreover, various implementations have particular additional benefits. For instance, as mentioned above in relation to FIG. 2, the loop architecture 600 illustrated in FIG. 6 has several gain effects. Some of these additional effects are illustrated in FIGS. 2A and 2B. More specifically, FIG. 2A conceptually illustrates an unmatched-gain effect 205A and a compensation vector 207A. As shown in FIG. 2A, loop filtering undesirably causes unmatched-gain 205A for the low pass and high pass portions of the signal curves. However, some of the embodiments described above further automatically provide a compensation vector 207A that advantageously compensates for the unmatched portion to match the gains between the low and high pass filtering.

FIG. 2B further illustrates an example of unmatched-gain 205B and signal compensation 207B in greater complexity and detail. As shown in FIG. 2B, the unmatched gain 205B is likely to be a complex function that continuously varies.

Regardless of complexity and variation, embodiments of the invention advantageously match the low pass and high pass filtering gains, in real time, and automatically adapt to gain, K, and/or environmental fluctuations. Accordingly, the embodiments described above have a number features and advantages including real time adaptation without the need for complex monitoring and/or control systems.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of determining a gain nonlinearity, the method comprising:
   receiving a phase difference;
   generating an output frequency based on the received phase difference;
   reconstructing a waveform by using the output frequency thereby forming a reconstructed waveform;
   preprocessing the phase difference to generate a comparison waveform;
   comparing the reconstructed waveform to the comparison waveform using a segment-by-segment multi-segment comparison; and
   determining a gain nonlinearity based on the comparison between the reconstructed and comparison waveforms.

2. The method of claim 1, wherein reconstructing the waveform comprises reconstructing the waveform using segmented waveform reconstruction.

3. The method of claim 1, further comprising storing a result of comparing in a calibration table, wherein comparing further comprises updating the calibration table.

4. The method of claim 1, further comprising a multi-segment calibration table.

5. The method of claim 1, wherein determining the gain nonlinearity occurs in real time during the processing of a signal.

6. The method of claim 1, wherein the gain nonlinearity is related to one of the set comprising design and process.

7. The method of claim 1, further comprising a gain nonlinearity variation related to one or more of a temperature change, a part-to-part difference, and a device aging.

8. The method of claim 1, further comprising compensating for the determined gain nonlinearity.

9. The method of claim 8, wherein compensating further comprises:
   generating a compensation vector; and
   generating the output frequency based on the compensation vector.

10. The method of claim 9, wherein the compensation vector is generated by using a segment-by-segment comparison.

11. A method of compensating a gain nonlinearity, the method comprising:
    receiving a phase difference signal;
    generating an output frequency based on the received phase difference signal;
    estimating the gain nonlinearity from the output frequency and the phase difference signal using a segment-by-segment multi-segment comparison; and
    compensating for the estimated gain nonlinearity.

12. The method of claim 11, wherein estimating the gain nonlinearity further comprises:
    reconstructing a waveform by using the output frequency;
    preprocessing the phase difference signal to generate a comparison waveform;
    comparing the reconstructed waveform to the comparison waveform using the segment-by-segment multi-segment comparison; and
    determining a gain nonlinearity based on the comparison between the reconstructed and comparison waveforms.

13. The method of claim 11, wherein compensating further comprises:
    generating a compensation vector;
    generating the output frequency based on the compensation vector.

14. The method of claim 13, wherein the compensation vector is generated by using a segment-by-segment comparison.

15. The method of claim 11, further comprising storing the estimated gain nonlinearity in a compensation table.

16. The method of claim 15, further comprising updating the compensation table in real time.

17. A modulation system comprising:
    a voltage controlled oscillator for
       receiving a tuning signal based on a phase difference; and
       generating an output frequency;
    a waveform reconstructor coupled to the voltage controlled oscillator, the waveform constructor for reconstructing a waveform based on the output frequency; and
    a comparator coupled to the waveform reconstructor, the comparator for comparing the output of the waveform reconstructor with a signal based on the phase difference using a segment-by-segment multi-segment comparison,
    wherein the comparator is configured for determining a gain nonlinearity exhibited by the voltage controlled oscillator.

18. The system of claim 17, further comprising a preprocessor coupled to the comparator, the preprocessor configured for:
    receiving the phase difference; and
    preprocessing the phase difference to match a characteristic of the output of the waveform reconstructor.

19. The system of claim 18, wherein the characteristic comprises filtering.

20. The system of claim 17, wherein the waveform reconstructor is configured to reconstruct the waveform using segmented waveform reconstruction.

21. The system of claim 17, further comprising a calibration table configured to store information relating to a waveform comparison.

22. The system of claim 17, further comprising a compensator for generating a compensation vector, the compensation vector for calibrating the voltage controlled oscillator such that the gain nonlinearity is reduced.

* * * * *